United States Patent
Kim et al.

(10) Patent No.: US 7,715,253 B2
(45) Date of Patent: May 11, 2010

(54) SEMICONDUCTOR MEMORY DEVICE AND METHOD FOR OPERATING THE SAME

(75) Inventors: Kyoung-Nam Kim, Gyeonggi-do (KR); Ho-Youb Cho, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 121 days.

(21) Appl. No.: 12/164,984

(22) Filed: Jun. 30, 2008

(65) Prior Publication Data
US 2009/0168565 A1 Jul. 2, 2009

(30) Foreign Application Priority Data
Dec. 28, 2007 (KR) .................. 10-2007-0140333

(51) Int. Cl.
*G11C 7/00* (2006.01)
(52) U.S. Cl. .............. 365/193; 365/194; 365/233.1
(58) Field of Classification Search ............ 365/193, 365/194, 233.1
See application file for complete search history.

(56) References Cited

U.S. PATENT DOCUMENTS 7,558,932 B2 * 7/2009 Cho .................. 711/167
7,606,089 B2 * 10/2009 Joo .................. 365/193
2007/0216917 A1 * 9/2007 Wakasugi .................. 358/1.9
2009/0116314 A1 * 5/2009 Byun .................. 365/194

FOREIGN PATENT DOCUMENTS

| KR | 1020040002269 A | 1/2004 |
| KR | 1020040102899 A | 12/2004 |
| KR | 1020070107240 A | 11/2007 |

OTHER PUBLICATIONS

Notice of Allowance issued from Korean Intellectual Property Office on Sep. 14, 2009.

* cited by examiner

*Primary Examiner*—Connie C Yoha
(74) *Attorney, Agent, or Firm*—IP & T Law Firm PLC

(57) ABSTRACT

Semiconductor memory device and method for operating the same comprise an auxiliary driver configured to output an internal strobe signals generated corresponding to a read command as a plurality of auxiliary strobe signal in response to a control signal, wherein the auxiliary driver bypass a first output auxiliary strobe signal, and delay to output the rest of the auxiliary strobe signal among the outputted auxiliary strobe signal and a strobe signal generator for driving the auxiliary strobe signal to output the delayed auxiliary strobe signal as a data strobe signals.

22 Claims, 5 Drawing Sheets

SEMICONDUCTOR MEMORY DEVICE AND METHOD FOR OPERATING THE SAME

CROSS-REFERENCE TO RELATED APPLICATIONS

The present invention claims priority of Korean patent application number 10-2007-0140333, filed on Dec. 28, 2007, which is incorporated by reference in its entirety.

BACKGROUND OF THE INVENTION

The present invention relates to a semiconductor memory device, and more particularly, to a data output control circuit that can control an internal operation to output data corresponding to an external command in synchronization with a system clock.

In a system with a variety of semiconductor devices, a semiconductor memory device serves as a data storage. The semiconductor memory device outputs data corresponding to addresses received from a data processor, e.g., a central processing unit (CPU), or stores data received from the data processor into unit cells selected by addresses input together with the data.

As the operating speed of the system increases, the data processor requires the semiconductor memory device to output and store data at higher speed. For the purpose of high-speed data input and output, a synchronous memory device was developed. The synchronous memory device inputs and outputs data in synchronization with a system clock. However, because even the synchronous memory device could not meet the required data input/output speed, a double data rate (DDR) memory device was developed. The DDR memory device inputs or outputs data at falling edges and rising edges of the system clock.

The DDR memory device must process two data during one cycle of the system clock so as to input/output data at a falling edge and a rising edge of the system clock. Specifically, the DDR memory device must output data exactly in synchronization with the rising edge and the falling edge of the system clock. To this end, a data output control circuit of the DDR memory device controls timings of outputting and transferring data to output the data in synchronization with rising and falling edges of the system clock.

The semiconductor memory device must output data corresponding to an external read command after several cycles of the system clock from the receipt of the external command. A column address strobe (CAS) latency (CL) represents a start timing of the data output. Generally, the semiconductor memory device supports multiple CLs and can adjust them according to operation environments. The CL is set in a mode register set (MRS). When the external read command is input, the semiconductor memory device determines a data output timing according to the CL set in the MRS.

However, the system clock inevitably has a delay time until it arrives at a data output circuit because it passes through a clock input buffer, a clock transmission line, etc. Thus, if the semiconductor memory device outputs data in synchronization with the delayed system clock, an external device will receive data that are not synchronized with rising edges and falling edges of the system clock. To solve this problem, the semiconductor memory device uses a delay locked loop (DLL) circuit to lock a delay of a clock signal. The DLL circuit compensates the delay caused by internal circuits of the semiconductor memory device until the system clock input to the semiconductor memory device is transferred to the data output control circuit.

In order to exactly output the data corresponding to the external command after the CL, the semiconductor memory device uses a data output control circuit that determines a data output timing by using a DLL clock output from a DLL circuit and a CL set in an MRS.

FIG. 1 is a block diagram of a data output control circuit in a typical semiconductor memory device.

Referring to FIG. 1, the data output control circuit includes a delay locked loop (DLL) circuit 110, an output signal generator 120, a clock divider 130, a synchronizer 140, a pre-driver 150 and a strobe generator 160. The data output control circuit receives an output enable signal and DLL clocks IRCLKDLL and IFCLKDLL to generate a data strobe signal DQS to indicate data output timing. The output enable signal is generated in response to a write command. The DLL clocks IRCLKDLL and IFCLKDLL are generated by compensating delay of an external clock CLK which is generated while the external clock are transferred in the semiconductor memory device.

Specifically, the DLL circuit 110 performs a delay locking operation on the external clock CLK using a clock pulse CLKP4 corresponding to rising edges of the external clock. As such, the DLL circuit 110 compensates internal delays of the external clock to output the DLL clocks IRCLKDLL and IFCLKDLL to the clock divider 130 and the output signal generator 120.

The output signal generator 120 generates a plurality of enable signals OE00, OE10, OE15, OE20, OE25, OE30, OE35 and OE40 in response to a read pulse CASP6_RD received from a command decoder (not shown). Durations of activation sections of the plurality of enable signals OE00, OE10, OE15, OE20, OE25, OE30, OE35 and OE40 are determined by a burst control signal YBSTA1 corresponding to a burst length (BL) set in an MRS. Then, the output signal generator 120 outputs rising and falling output enable signals ROUTEN and FOUTEN to the clock divider 130 by selecting one of the plurality of enable signals OE00, OE10, OE15, OE20, OE25, OE30, OE35 and OE40 according to a CL.

Also, the output signal generator 120 outputs a pre-enable signal QSENPRE to the synchronizer 140 to set operation margins of a data strobe signal DQS and control a data output buffer so that data D0, D1, D2 and D3 corresponding to the read command are output in synchronization with the data strobe signal DQS, before the output of the data strobe signal DQS. Here, the pre-enable signal QSENPRE is activated 0.5 tCK earlier than the rising output enable signal ROUTEN, and 1 tCK earlier than the falling output enable signal FOUTEN. In addition, the output signal generator 120 performs an OR operation on the pre-enable signal QSENPRE and the falling output enable signal FOUTEN to generate a strobe enable signal QSEN.

The clock divider 130 transfers the DLL clocks IRCLKDLL and IFCLKDLL and the rising and falling output enable signals ROUTEN and FOUTEN. The clock divider 130 serves as a driver for transferring the DLL clocks IRCLKDLL and IFCLKDLL and the rising and falling output enable signals ROUTEN and FOUTEN to each data pad of the semiconductor memory device.

The synchronizer 140 receives second DLL clocks RCLKDLL2 and FCLKDLL2, a second rising output enable signal ROUTEN2, and a second falling output enable signal FOUTEN2 from the clock divider 130, and receives the pre-enable signal QSENPRE from the output signal generator 120 to output a rising strobe signal RCLKDOQS, a falling strobe signal FCLKDOQS, a pre-operation signal QSPRECK, and an off signal QSOFF. The pre-operation signal QSPRECK and the off signal QSOFF are used to secure a pre-operation margin and a post-operation margin of the data strobe signal DQS. Specifically, the synchronizer 140 receives the second DLL clocks RCLKDLL2 and FCLKDLL2 from the clock divider 130 to output rising and falling strobe signals RCLKDOQS and FCLKDOQS when the second rising enable signal ROUTEN2 and a falling output enable signal FOUTEN2 are activated by the clock divider 130. In addition, the synchronizer 140 generates the pre-operation signal QSPRECK in synchronization with a rising edge of the pre-enable signal QSENPRE, and the off signal QSOFF in synchronization with a falling edge of the strobe enable signal QSEN.

Thereafter, the pre-driver 150 secures the pre-operation margin in response to the pre-operation signal QSPRECK, generates an internal strobe signal PRE_DQS in response to the rising and falling strobe signals RCLKDOQS and FCLKDOQS, and then secures the post-operation margin in response to the off signal QSOFF.

The strobe generator 160 receives the internal strobe signal PRE_DQS of a CMOS level from the pre-driver 150 to generate a data strobe signal DQS having a small voltage swing width according to a predefined specification.

FIG. 2 is a timing diagram illustrating an operation of the typical semiconductor memory device of FIG. 1.

Referring to FIG. 2, the DLL circuit 110 performs a delay locking operation on an external clock CLK to generate a rising DLL clock IRCLKDLL corresponding to a rising edge of the external clock CLK and a falling DLL clock IFCLKDLL corresponding to a falling edge of the external clock CLK.

When an external read command is input, the command decoder outputs a read pulse CASP6_RD. The read pulse CASP6_RD is input into the output signal generator 120 together with a burst control signal YBSTA1 corresponding to a BL set in the MRS. Also, the command decoder outputs an operation mode signal WT10BT11 corresponding to the read command. The operation mode signal WT10BT11 has a logic low level in a read mode, and a logic high level in a write mode. When command is applied, the operation mode signal WT10BT11 is input into the data output control circuit to indicate an operation to be performed by the semiconductor memory device.

The output signal generator 120 generates a plurality of enable signals OE00, OE10, OE15, OE20, OE25, OE30, OE35 and OE40 in response to the read pulse CASP6_RD. Activation timing of each enable signal is determined according to the rising and falling DLL clocks IRCLKDLL and IFCLKDLL, and a duration of the activation section is determined according to the burst control signal YBSTA1. The output signal generator 120 outputs rising and falling output enable signals ROUTEN and FOUTEN and a pre-enable signal QSENPRE by selecting respective enable signals among the plurality of enable signals OE00, OE10, OE15, OE20, OE25, OE30, OE35 and OE40 according to the CL set in the MRS. Also, the output signal generator 120 generates a strobe enable signal QSEN using the pre-enable signal QSENPRE and the falling output enable signal FOUTEN.

The synchronizer 140 extracts a rising strobe signal RCLKDOQS and a falling strobe signal FCLKDOQS using signals received from the clock divider 130, and generates a pre-operation signal QSPRECK and an off signal QSOFF of a clock type to secure a pre-operation margin and a post-operation margin of a data strobe signal DQS. Then, the pre-driver 150 generates an internal strobe signal PRE_DQS of a CMOS level, and the strobe generator 160 converts the level of the internal signal PRE_DQS to output a data strobe signal DQS.

Referring again to FIG. 2, when the BL is 4, data D0 to D3 are aligned with the data strobe signal DQS and output after CL from the receipt of the read command RD. In a general semiconductor memory device, data are input/output based on the external clock CLK. However, as the frequency of the external clock CLK increases and the data transferring speed increases, the phase of the external clock CLK can be affected by operation environments such as temperature, voltage level, and process. Therefore, in order to secure a stable data valid window for input/output data, a high-speed semiconductor memory device aligns data with a data strobe signal DQS before outputting them to the outside. Also, the data strobe signal DQS secures operation margins of logic low level before/after outputting the data D0 to D3 to prevent the data contention. In a high-speed semiconductor memory device, the data strobe signal DQS transits between a logic low level and a logic high level not to have a high voltage level difference. If the data strobe signal DQS transits to have a high voltage level difference like the external clock CLK, power consumption for operating the semiconductor memory device increases. If drivability of the strobe generator 160 is reduced to reduce the power consumption, the data strobe signal DQS cannot make up with the data input/output speed.

FIG. 3 is a timing diagram illustrating a problem of the typical semiconductor memory device of FIG. 1.

Referring to FIG. 3, in a high frequency operation, the data strobe signal DQS has a logic low level of a ground voltage level for a predetermined pre-operation margin. At a time point of outputting the first data (i.e., after CL from the input of the read command), a first logic level transition occurs. Here, the data strobe signal DQS transits from a ground voltage level (0 V) to a logic high level. However, swing widths of the following transitions are reduced to reduce power consumption and ensure a high-speed performance.

Since the drivability of the strobe signal DQS is adjusted to output a data strobe signal DQS of a reduced swing width, the transition of the data strobe signal DQS at the point of outputting the first data is delayed to some degree. This means that the data valid window of the first output data becomes smaller than those of other following data.

SUMMARY OF THE INVENTION

Embodiments of the present invention are directed to providing a semiconductor memory device capable of outputting data of a uniform data valid window using a system clock with high frequency, and a method for operating the same.

In accordance with an aspect of the present invention, there is provided an auxiliary driver configured to output an internal strobe signals generated corresponding to a read command as a plurality of auxiliary strobe signal in response to a control signal, wherein the auxiliary driver bypass a first output auxiliary strobe signal, and delay to output the rest of the auxiliary strobe signal among the outputted auxiliary strobe signal and a strobe signal generator for driving the auxiliary strobe signal to output the delayed auxiliary strobe signal as a data strobe signals.

In accordance with the embodiments of the present invention, the data output control circuit of the semiconductor memory device includes a strobe generator configured to receive internal strobe signals generated in response to a read command, to drive data strobe signals with which output data are aligned. The data output control circuit also includes an auxiliary driver configured to receive the internal strobe signals to output the internal strobe signals without delay needed when the strobe generator drives the data strobe signal corresponding to the first output data.

The data output control circuit can control the timing of outputting data in response to the external read command so that an operation margin is uniformly maintained regardless of the variations of operation environments such as a voltage level, temperature and a process, and thus data can be output stably. The data output control unit does not include additional delay lines, which were used to control activation timing of the output signal but failed to maintain constant delay time due to the variations of operation environments. Instead, the data output control circuit in accordance with an embodiment of the present invention generates a signal corresponding to a rising edge of the system clock using a signal corresponding to a falling edge of the system clock, to sequentially activate output signals thereof.

DESCRIPTION OF SPECIFIC EMBODIMENTS

Hereinafter, a semiconductor memory device and a method for operating the same in accordance with the present invention will be described in detail with reference to the accompanying drawings.

Figure 1:
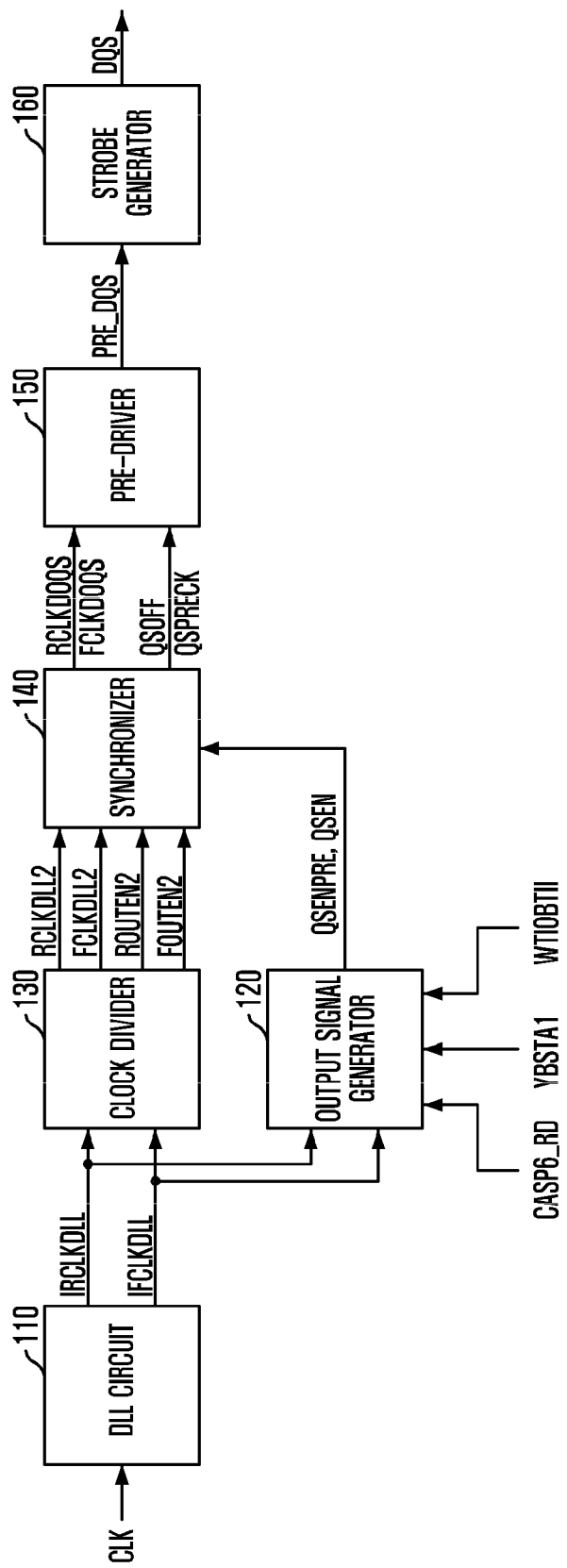
FIG. 1 is a block diagram of a data output control circuit in a typical semiconductor memory device.
Figure 2:
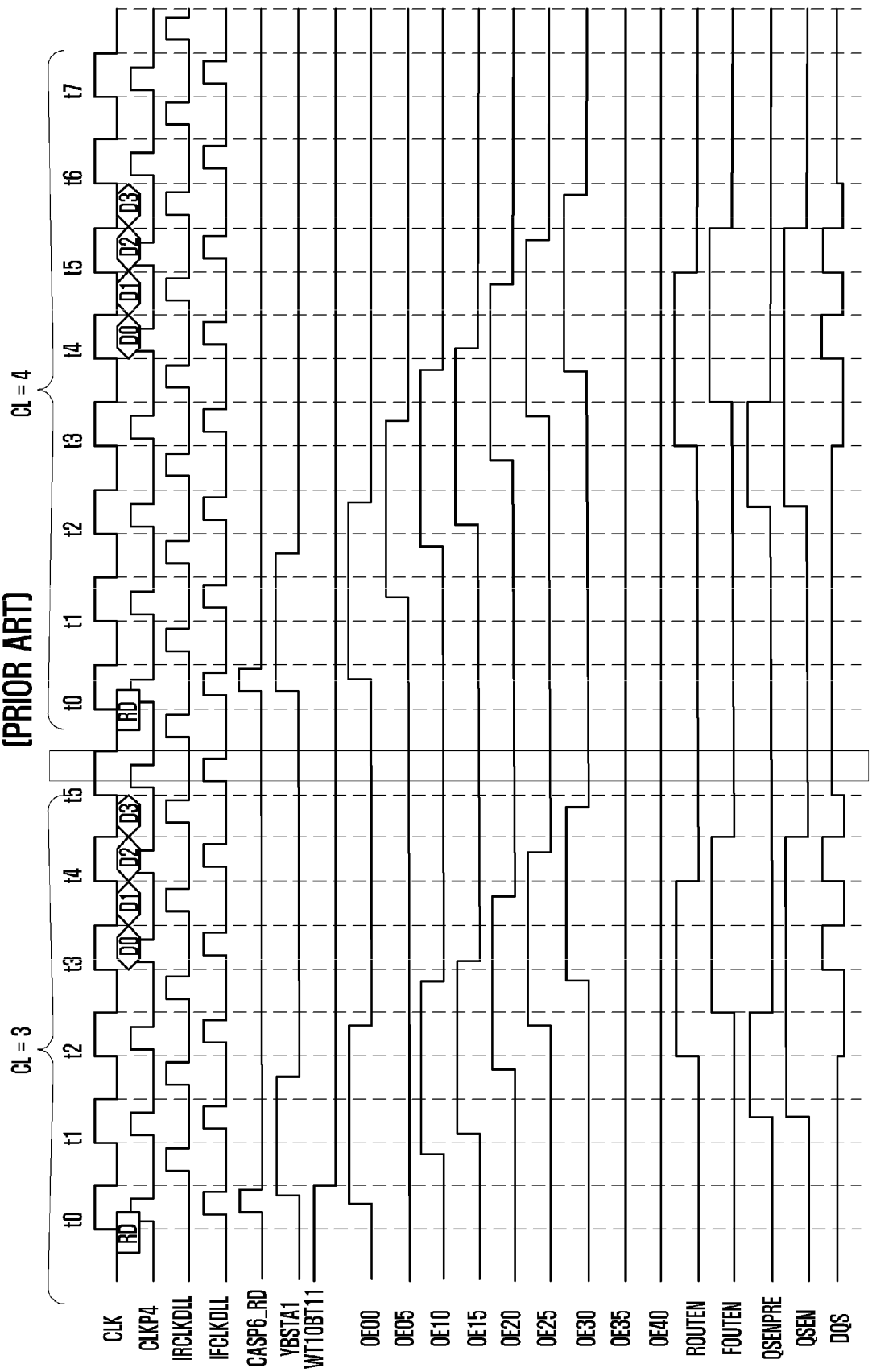
FIG. 2 is a timing diagram illustrating an operation of the typical semiconductor memory device of FIG. 1.
Figure 3:
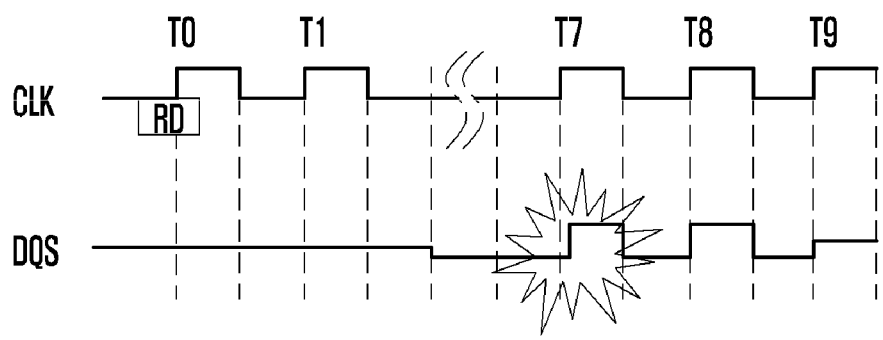
FIG. 3 is a timing diagram illustrating a problem of the typical semiconductor memory device of FIG. 1.
Figure 4:
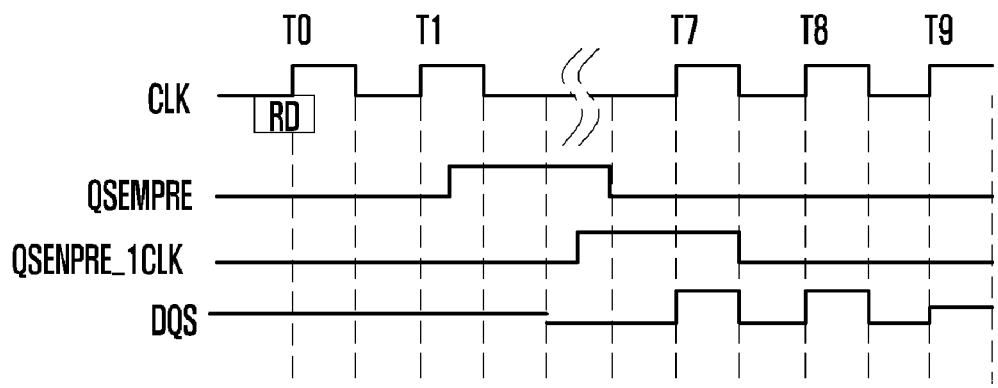
FIG. 4 is a timing diagram illustrating a method for solving the problem of the typical semiconductor memory device of FIG. 1.

FIG. 4 is a timing diagram illustrating a method for solving the problem of the typical semiconductor memory device of FIG. 1.

Referring to FIG. 4, the semiconductor memory device advances output timing of the first rising edge of a data strobe signal DQS in a high-frequency operation, so that the first output data are aligned with that. Accordingly, a duration for outputting the first rising edge can become identical to the duration for outputting the following falling and rising edges (i.e., the duration for transition of a logic level of the data strobe signal DQS).

In more detail, by shifting a phase of a pre-enable signal QSENPRE, drivability of the data output control circuit is changed not to delay the outputting of the rising edge of the strobe signal. Configuration and operation of the data output control circuit for changing the drivability in outputting the data strobe signal DQS in the semiconductor memory device will be described below.

Figure 5:
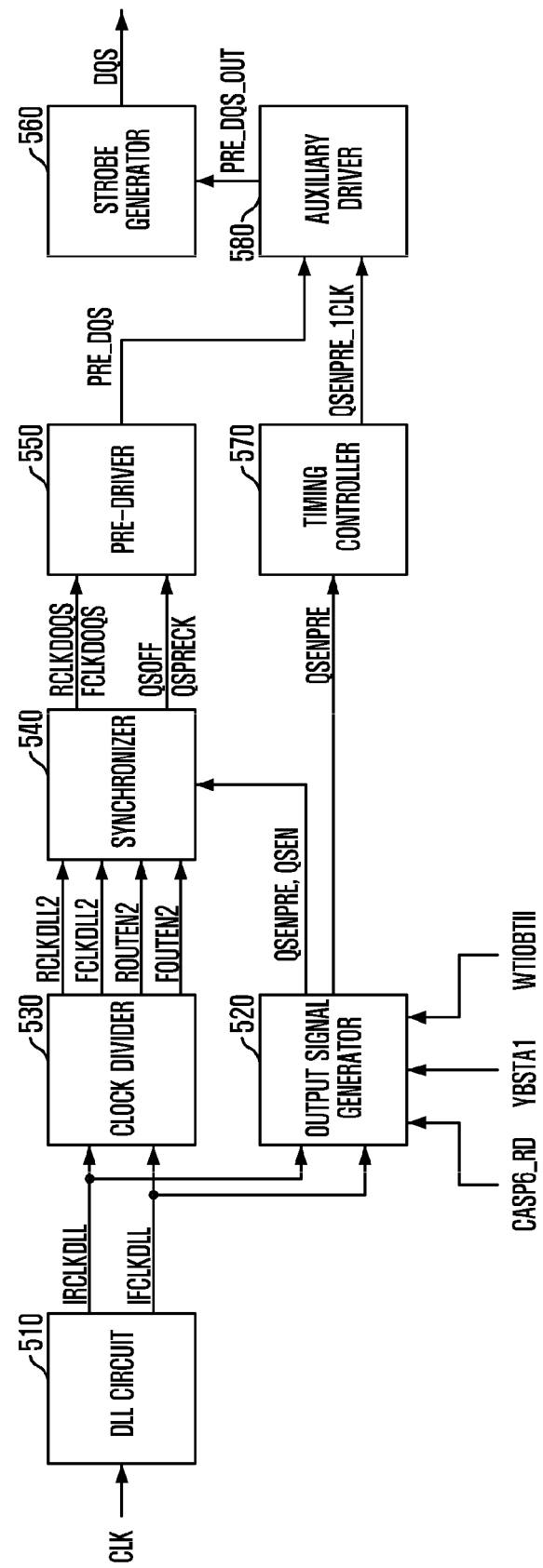
FIG. 5 is a block diagram of a data output control circuit in a semiconductor memory device in accordance with an embodiment of the present invention.

FIG. 5 is a block diagram of a data output control circuit in a semiconductor memory device in accordance with an embodiment of the present invention.

Referring to FIG. 5, the data output control circuit of the semiconductor memory device includes a DLL circuit 510 and a strobe signal generation circuit. The DLL circuit 510 performs a delay locking operation on an external clock to compensate an internal delay of the external clock in the semiconductor memory device, thereby outputting DLL clocks IRCLKDLL and IFCLKDLL. The strobe signal generation circuit generates data strobe signals DQS corresponding to a plurality of data according to a CL and BL based on the DLL clocks IRCLKDLL and IFCLKDLL to output the data strobe signals DQS, in response to a read command RD. The strobe signal generation circuit outputs the data strobe signal corresponding to the first output data earlier than the first output data.

The strobe signal generation circuit includes a strobe generator 560 and an auxiliary driver 580. The strobe generator 560 receives an internal strobe signal PRE_DQS_OUT generated in response to the read command RD, to drive the aligned plurality of data and data strobe signal DQS. The auxiliary driver 580 receives the internal strobe signal PRE_DQS to output the data strobe signal DQS corresponding to the first output data earlier than the strobe generator. Especially, the auxiliary driver 580 does not delay the internal strobe signal PRE_DQS corresponding to the first output data, while delaying the internal strobe signals PRE_DQS corresponding to the other data by a delay time required by the strobe generator 560 to output the data strobe signal DQS.

Also, the data output control circuit further includes a timing controller 570. The timing controller 570 outputs a control pulse QSENPRE_1CLK to the auxiliary driver, the control pulse being activated before the first output data is output and deactivated after the first output data is output. The timing controller 570 receives a pre-enable signal QSENPRE from the control signal generator 520 to generate a control pulse QSENPRE_1CLK for controlling the auxiliary driver 580.

The data output control circuit further includes an output signal generator 520, a clock divider 530, a synchronizer 540, a pre-driver 550, and a strobe generator 560.

The DLL circuit 510 performs a delay locking operation on the external clock CLK to compensate internal delay of the external clock CLK, thereby outputting DLL clocks IRCLKDLL and IFCLKDLL to the clock divider 530 and the output signal generator 520.

The output signal generator 520 generates a plurality of enable signals OE00, OE10, OE15, OE20, OE25, OE30, OE35 and OE40 in response to a read pulse CASP6_RD received from a command decoder (not shown) which decodes external commands. Durations of activation sections of the plurality of enable signals are determined by a burst control signal YBSTA1 corresponding to a BL set in an MRS. Then, the output signal generator 520 outputs rising and falling output enable signals ROUTEN and FOUTEN to the clock divider 530 by selecting one of the plurality of enable signals OE00, OE10, OE15, OE20, OE25, OE30, OE35 and OE40 according to a CL.

Also, the output signal generator 520 outputs a pre-enable signal QSENPRE to the synchronizer 540 to set operation margins of a data strobe signal DQS and control a data output buffer so that data D0, D1, D2 and D3 corresponding to the read command RD are output in synchronization with the data strobe signal DQS, before the output of the data strobe signal DQS. Here, the pre-enable signal QSENPRE is activated 0.5 tCK earlier than the rising output enable signal ROUTEN, and 1 tCK earlier than the falling output enable signal FOUTEN. In addition, the output signal generator 520 performs an OR operation on the pre-enable signal QSENPRE and the falling output enable signal FOUTEN to generate a strobe enable signal QSEN.

The clock divider 530 transfers the DLL clocks IRCLKDLL and IFCLKDLL and the rising and falling output enable signals ROUTEN and FOUTEN. The clock divider 530 serves as a driver for transferring the DLL clocks IRCLKDLL and IFCLKDLL and the rising and falling output enable signals ROUTEN and FOUTEN to each data pad of the semiconductor memory device.

The synchronizer 540 receives second DLL clocks RCLKDLL2 and FCLKDLL2, a second rising output enable signal ROUTEN2, and a second falling output enable signal FOUTEN2 from the clock divider 530, and receives the pre-enable signal QSENPRE from the output signal generator 520 to output a rising strobe signal RCLKDOQS, a falling strobe signal FCLKDOQS, a pre-operation signal QSPRECK, and an off signal QSOFF. The pre-operation signal QSPRECK and the off signal QSOFF are used to secure a pre-operation margin and a post-operation margin of the data strobe signal DQS. Specifically, the synchronizer 540 receives the second DLL clocks RCLKDLL2 and FCLKDLL2 from the clock divider 530 to output rising and falling strobe signals RCLKDOQS and FCLKDOQS when the second rising enable signal ROUTEN2 and a falling output enable signal FOUTEN2 are activated by the clock divider 530. In addition, the synchronizer 540 generates the pre-operation signal QSPRECK in synchronization with a rising edge of the pre-enable signal QSENPRE, and the off signal QSOFF in synchronization with a falling edge of the strobe enable signal QSEN.

Thereafter, the pre-driver 550 secures the pre-operation margin in response to the pre-operation signal QSPRECK, generates an internal strobe signal PRE_DQS in response to the rising and falling strobe signals RCLKDOQS and FCLK-DOQS, and then secures the post-operation margin in response to the off signal QSOFF.

The timing controller 570 delays a phase of the pre-enable signal QSENPRE by one cycle of the external clock CLK to output a control pulse QSENPRE_1CLK to the auxiliary driver 580. Here, the pre-enable signal QSENPRE is generated from the output signal generator 520 by selecting one enable signal among the plurality of enable signals OE00, OE10, OE15, OE20, OE25, OE30, OE35 and OE4 as described above. The pre-enable signal QSENPRE is used for securing the pre-operation margin of the data strobe signal DQS, which generally corresponds to one cycle of the external clock CLK as shown in FIG. 4. The synchronizer 540 synchronizes the pre-enable signal QSENPRE with the external clock CLK to generate a pre-operation signal QSPRECK, which determines a pre-operation margin of the data strobe signal DQS. The pre-enable signal QSENPRE is activated at least one cycle of the external clock CLK earlier than the first rising edge of the data strobe signal DQS with which the first output data is synchronized. Therefore, since the control pulse QSENPRE_1CLK is generated by delaying the pre-enable signal QSENPRE by one cycle of the external clock CLK in the timing controller 570, the control pulse QSENPRE_1CLK is activated at the timing of outputting the first edge of the data strobe signal DQS.

While the control pulse QSENPRE_1CLK is activated, the auxiliary driver 580 does not delay the internal strobe signal PRE_DQS received from the pre-driver 550 to directly output it to the strobe generator 560 as an auxiliary strobe signal PRE_DQS_OUT. However, while the control pulse QSENPRE_1CLK is deactivated, the auxiliary driver 580 delays the internal strobe signal PRE_DQS by a delay time corresponding to a time duration required by the strobe generator 560 to drive the data strobe signal DQS.

The strobe generator 560 receives the delayed or not delayed internal strobe signal PRE_DQS from the auxiliary driver 580 as the auxiliary strobe signal PRE_DQS_OUT to generate a data strobe signal DQS having a small voltage swing width according to a predefined specification. However, while the control pulse QSENPRE_1CLK is activated (i.e., during the first rising edge), the auxiliary strobe signal PRE_DQS_OUT from the auxiliary driver 580 is output as a data strobe signal DQS rather than the internal strobe signal PRE_DQS. As such, the first rising edge of the data strobe signal DQS corresponding to the first output data can be prevented from being delayed by the large voltage swing width.

Figure 6:
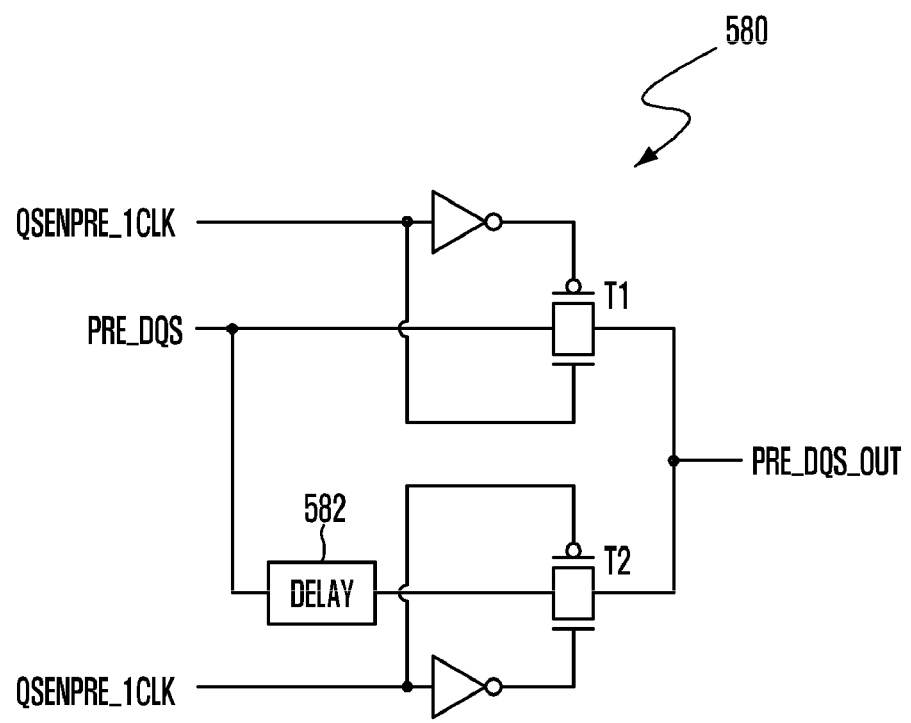
FIG. 6 is a circuit diagram of an auxiliary driver shown in FIG. 5.

FIG. 6 is a circuit diagram of an auxiliary driver shown in FIG. 5.

Referring to FIG. 6, the auxiliary driver 580 includes a first transfer gate T1, a delay line 582, and a first transfer gate T2. The first transfer gate T1 outputs an internal strobe signal PRE_DQS as an auxiliary strobe signal PRE_DQS_OUT while a control pulse QSENPRE_1CLK is activated. The delay line 582 delays the internal strobe signal PRE_DQS by a drive time of the strobe generator 560. The second transfer gate T2 outputs the output signal of the delay line 582 as an auxiliary strobe signal PRE_DQS_OUT while the control pulse QSENPRE_1CLK is deactivated. Here, the delay line 582 may have the same configuration as the signal transfer path in the strobe generator 560.

A method for operating the semiconductor memory device to prevent the first rising edge of the data strobe signal DQS from being delayed by the large swing width in accordance with an embodiment of the present invention will be described below. The method includes: performing a delay locking operation on an external clock CLK to compensate internal delay of the external clock, to output delay locked loop clocks IRCLKDLL and IFCLKDLL; generating a plurality of enable signals OE00, OE10, OE15, OE20, OE25, OE30, OE35 and OE40 having pulse widths corresponding to a burst length (BL) based on the delay locked loop clocks IRCLKDLL and IFCLKDLL; generating internal strobe signals PRE_DQS with which a plurality of data corresponding to a read command RD are aligned to be output by selecting one of the plurality of enable signals OE00, OE10, OE15, OE20, OE25, OE30, OE35 and OE40 according to a column address strobe latency (CL); outputting the internal strobe signal PRE_DQS corresponding to the first output data among the plurality of data earlier than the first output data.

Specifically, the generating of the internal strobe signals includes: generating output enable signals ROUTEN and FOUTEN, a pre-enable signal QSENPRE, and a strobe enable signal QSEN by selecting the respective enable signals among the plurality of enable signals OE00, OE10, OE15, OE20, OE25, OE30, OE35 and OE40 according to the CL; extracting the delay locked loop clocks IRCLKDLL and IFCLKDLL to generate strobe signals RCLKDOQS and FCLKDOQS when the output enable signals ROUTEN and FOUTEN are activated; generating margin clock signals QSPRECK and QSOFF for securing operation margins of the data strobe signal DQS in response to the pre-enable signal QSENPRE and the strobe enable signal QSEN; and combining the strobe signals RCLKDOQS and FCLKDOQS and the margin clock signals QSPRECK and QSOFF to output the internal strobe signals PRE_DQS.

The outputting of the internal strobe signal PRE_DQS corresponding to the first output data includes: shifting phase of the pre-enable signal QSENPRE by one cycle of the external clock CLK to output a control pulse QSENPRE_1CLK; transferring the internal strobe signal PRE_DQS corresponding to the first output data as the data strobe signal DQS without delay in response to the control pulse QSENPRE_1CLK; outputting the internal strobe signals PRE_DQS corresponding to following data at timings of outputting the following data.

As described above, the semiconductor memory device senses and amplifies a plurality of data to transfer the sensed and amplified data in response to a read command RD, and generates data strobe signals DQS corresponding to output timings of a plurality of data. Here, the semiconductor memory device in accordance with embodiments of the present invention increases drivability of the data strobe signal DQS corresponding to the first output data, to output the data strobe signal DQS. As such, the semiconductor memory device prevents delay at the first rising edge by using a signal for securing operation margin of the data strobe signal DQS in a high frequency operation. Therefore, time differences of the rising edges and the falling edges of the data strobe signal DQS can become uniform, and mismatch between the phases thereof can be prevented.

The semiconductor memory device in accordance with the embodiments of the present invention includes an internal operation control circuit that can have uniform operation margins regardless of variations of operation environments such as a voltage level, temperature and a process using a system clock with high frequency, thereby enhancing operation reliability.

In addition, the semiconductor memory device can control operation timing through simple design modification. Furthermore, since the semiconductor memory device does not need a plurality of delay lines, it is possible to enhance the device integrity and reduce power consumption.

While the present invention has been described with respect to the specific embodiments, it will be apparent to those skilled in the art that various changes and modifications may be made without departing from the spirit and scope of the invention as defined in the following claims.

What is claimed is:

1. A data output control circuit, comprising:
   an auxiliary driver configured to output an internal strobe signals generated corresponding to a read command as a plurality of auxiliary strobe signal in response to a control signal, wherein the auxiliary driver bypass a first output auxiliary strobe signal, and delay to output the rest of the auxiliary strobe signal among the outputted auxiliary strobe signal; and
   a strobe signal generator for driving the auxiliary strobe signal to output the delayed auxiliary strobe signal as a data strobe signals.

2. The data output control circuit as recited in claim 1, wherein the auxiliary driver outputs the auxiliary strobe signal after delaying by a driving time needed when the strobe signal generator outputs the data strobe signals.

3. The data output control circuit as recited in claim 2, further comprising a timing controller configured to output a control signal to the auxiliary driver, the control pulse being activated before the first output data is output and being deactivated after the first output data is output.

4. The data output control circuit as recited in claim 3, wherein the auxiliary driver comprises:
   a first transfer gate configured to output the internal strobe signals as the auxiliary strobe signals while the control signal is activated;
   a delay line configured to delay the internal strobe signals by the drive time to output delayed internal strobe signals; and
   a second transfer gate configured to output the delayed internal strobe signals as the auxiliary strobe signals while the control signal is deactivated.

5. The data output control circuit as recited in claim 4, wherein the delay line outputs the internal strobe signals after delaying by a driving time needed when strobe signal generator outputs the data strobe signals 6. The data output control circuit as recited in claim 2, further comprising:
   an output signal generator configured to generate a plurality of enable signals based on a delay locked loop clock in response to the read command and a column address strobe latency, and generate an output enable signal, a pre-enable signal and a strobe enable signal by selecting the respective enable signals among the plurality of enable signals a synchronizer configured to extract the delay locked loop clock to generate a strobe signal when the output enable signal is activated, and generate a margin clock signal in response to the pre-enable signal and the strobe enable signal to secure an operation margin of the data strobe signal; and
   a timing controller configured to shift a phase of the pre-enable signal by one cycle of an external clock to output the control signal; and
   a pre-driver configured to receive the strobe signal and the margin clock signal to output the strobe signal and the margin clock signal as the internal strobe signal.

7. The data output control circuit as recited in claim 6, wherein the auxiliary driver comprises:
   a first transfer gate configured to output the internal strobe signal as the data strobe signal while the control signal is activated;
   a delay line configured to delay the internal strobe signal by the drive time to output a delayed internal strobe signal; and
   a second transfer gate configured to output the delayed internal strobe signal as the data strobe signal while the control pulse is deactivated.

8. A semiconductor memory device, comprising:
   a delay locked loop circuit configured to perform a delay locking operation on an external clock to compensate internal delay of the external clock, to output a delay locked loop clock; and
   a strobe signal generation circuit configured to generate data strobe signals corresponding to a plurality of data which are output in response to a read command, according to a column address strobe latency and a burst length on the basis of the delay locked loop clock,
   wherein the data strobe signal corresponding to the first output data is output from the strobe signal generation circuit earlier than the first output data.

9. The semiconductor memory device as recited in claim 8, wherein the strobe signal generation circuit comprises:
   an auxiliary driver configured to output an internal strobe signals generated corresponding to a read command as a plurality of auxiliary strobe signal in response to a control signal, wherein the auxiliary driver bypass a first output auxiliary strobe signal, and delay to output the rest of the auxiliary strobe signal among the outputted auxiliary strobe signal; and
   a strobe signal generator for driving the auxiliary strobe signal to output the delayed auxiliary strobe signal as a data strobe signals.

10. The semiconductor memory device as recited in claim 9, wherein the auxiliary driver outputs the auxiliary strobe signal after delaying by a driving time needed when the strobe signal generator outputs the data strobe signals.

11. The semiconductor memory device as recited in claim 10, further comprising:
   an output signal generator configured to generate a plurality of enable signals based on the delay locked loop clocks in response to the read command, and generate an output enable signal, a pre-enable signal and a strobe enable signal by selecting the respective enable signals among the plurality of enable signals according to the column address strobe latency;

a synchronizer configured to extract the delay locked loop clock to generate a strobe signal when the output enable signal is activated, and generate a margin clock signal in response to the pre-enable signal and the strobe enable signal to secure an operation margin of the data strobe signal;

a timing controller configured to shift a phase of the pre-enable signal by one cycle of the external clock to output a control signal for controlling the auxiliary driver; and a pre-driver configured to receive the strobe signal and the margin clock signal to output the internal strobe signal.

12. The semiconductor memory device as recited in claim 11, wherein the auxiliary driver comprises:

a first transfer gate configured to output the internal strobe signal as the data strobe signal while the control signal is activated;

a delay line configured to delay the internal strobe signal by the drive time to output a delayed internal strobe signal; and a second transfer gate configured to output the delayed internal strobe signal as the data strobe signal while the control signal is deactivated.

13. The semiconductor memory device as recited in claim 11, further comprising a clock divider configured to transfer the output enable signal from the output signal generator and the delay locked loop clock from the delay locked loop circuit to the synchronizer.

14. A method for operating a semiconductor memory device, the method comprising:

performing a delay locking operation on an external clock to compensate internal delay of the external clock, to output a delay locked loop clock;

generating a plurality of enable signals having pulse widths corresponding to a burst length based on the delay locked loop clock;

generating internal strobe signals with which a plurality of data corresponding to a read command are aligned to be output, by selecting one of the plurality of enable signals according to a column address strobe latency; and outputting the internal strobe signal that corresponds to the first output data earlier than output timing of the first output data.

15. The method as recited in claim 14, wherein the generating of the internal strobe signals comprises:

generating an output enable signal, a pre-enable signal, and a strobe enable signal by selecting the respective enable signals according to the column address strobe latency;

extracting the delay locked loop clock to generate a strobe signal when the output enable signal is activated;

generating a margin clock signal for securing an operation margin of the data strobe signal in response to the pre-enable signal and the strobe enable signal; and combining the strobe signal and the margin clock signal to output the internal strobe signal.

16. The method as recited in claim 15, the method further comprising distributing the output enable signal and the delay locked loop clock to each of a plurality of internal regions connected to a plurality of data pads.

17. The method as recited in claim 15, wherein the outputting of the internal strobe signal corresponding to the first output data comprises:

shifting phase of the pre-enable signal by one cycle of the external clock to output a control signal;

transferring the internal strobe signal that corresponds to the first output data as the data strobe signal without delay in response to the control signal; and outputting the internal strobe signals that correspond to the following data at timings of outputting the following data.

18. A method for operating a semiconductor memory device, the method comprising:

sensing and amplifying a plurality of data in response to a read command;

generating internal strobe signals in response to the read command; and increasing drivability of a data strobe signal corresponding to the first output data in response to the internal strobe signals to output the data strobe signal.

19. The method as recited in claim 18, the increasing of the drivability comprises outputting the data strobe signal corresponding to the first output data earlier than the first output data, in response to the internal strobe signals.

20. The method as recited in claim 19, wherein the increasing of the drivability further comprises:

performing a delay locking operation on an external clock to compensate internal delay of the external clock to output a delay locked loop clock;

generating a plurality of enable signals having pulse widths corresponding to a burst length based on the delay locked loop clock; and generating the internal strobe signals with which the plurality of data are aligned to be output, by selecting one of the plurality of enable signals according to a column address strobe latency.

21. The method as recited in claim 20, wherein the generating of the internal strobe signals comprises:

generating an output enable signal, a pre-enable signal, and a strobe enable signal by selecting the respective enable signals according to the column address strobe latency;

extracting the delay locked loop clock to generate a strobe signal when the output enable signal is activated;

generating a margin clock signal for securing an operation margin of the data strobe signal in response to the pre-enable signal and the strobe enable signal; and combining the strobe signal and the margin clock signal to output the internal strobe signal.

22. The method as recited in claim 18, wherein the increasing of the drivability further comprises:

shifting phase of the pre-enable signal by one cycle of the external clock to output a control signal;

transferring the internal strobe signal that corresponds to the first output data as the data strobe signal without delay in response to the control signal; and outputting the internal strobe signals that correspond to the following data at timings of outputting the following data.

* * * * *